United States Patent [19]

Kiribayashi

[11] Patent Number: 5,065,506

[45] Date of Patent: Nov. 19, 1991

[54] METHOD OF MANUFACTURING CIRCUIT BOARD

[75] Inventor: Shoji Kiribayashi, Nara, Japan

[73] Assignee: Sharp Kabushiki Kaisha, Osaka, Japan

[21] Appl. No.: 590,790

[22] Filed: Oct. 1, 1990

[30] Foreign Application Priority Data

Oct. 5, 1989 [JP] Japan .................................. 1-261693

[51] Int. Cl.⁵ ............................................... H05K 3/30
[52] U.S. Cl. ...................................... 29/632; 174/52.4; 219/121.69; 219/121.71
[58] Field of Search ................... 219/121.66, 121.69, 219/121.61; 174/52.4, 117 F; 361/394, 398; 29/832

[56] References Cited

U.S. PATENT DOCUMENTS

| | | | |
|---|---|---|---|
| 3,689,991 | 9/1972 | Aird . | |
| 3,763,404 | 10/1973 | Aird . | |
| 3,832,769 | 9/1974 | Olyphant, Jr. et al. | 29/832 |
| 3,984,739 | 10/1976 | Mochizuki et al. | 174/52.4 X |
| 4,644,130 | 2/1987 | Bachmann | 219/121.69 |

FOREIGN PATENT DOCUMENTS

| | | |
|---|---|---|
| 53-134365 | 11/1978 | Japan . |
| 53-149764 | 12/1978 | Japan . |
| 56-46594 | 4/1981 | Japan . |
| 57-107093 | 7/1982 | Japan . |

OTHER PUBLICATIONS

IBM Technical Discl Bull, vol. 8, No. 3, Aug. 1965, p. 434, by Kremen.
IBM Technical Discl Bull, vol. 11, No. 9, Feb. 1969, p. 1151, by Smith et al.
IBM Technical Discl Bull, vol. 22, No. 4, Sep. 1979, p. 1417, by Howrilker et al.

Primary Examiner—Carl J. Arbes
Attorney, Agent, or Firm—Nixon & Vanderhye

[57] ABSTRACT

A method of manufacturing a circuit board, comprising the steps of providing an electric conductor on one surface of a substrate made of flexible synthetic resin and selectively irradiating a laser beam onto the substrate from the other surface of the substrate so as to sublimate a portion of the substrate such that an opening is formed on the substrate, with the electric conductor traversing the opening.

4 Claims, 5 Drawing Sheets

METHOD OF MANUFACTURING CIRCUIT BOARD

BACKGROUND OF THE INVENTION

The present invention relates to a method of manufacturing a circuit board to which, for example, an LSI (large scale integrated circuit) is connected.

In known ICs (integrated circuits), a bump acting as a projecting electrode is formed on one surface of an IC element and a conductor of the circuit board is electrically connected to the bump by heating, ultrasonic processing, etc. The conductor and a substrate made of synthetic resin are piled on each other. An opening is formed at a position of the substrate, where the IC element and the conductor coincide in position with each other such that the bump of the IC element and the conductor of the circuit board are placed on each other. Then, heating, ultrasonic processing, etc. are performed so as to electrically connect the conductor and the bump.

FIGS. 1(a) to 1(e) show a known method of manufacturing a circuit board. As shown in FIG. 1(a), perforating is initially performed on a resinous film 1 acting as a substrate so as to form an opening 4. Thereafter, as shown in FIG. 1(b), an electrically conductive metal foil 2 acting as a conductor is bonded to one surface of the resinous film 1. Then, as shown in FIG. 1(c), a protective film 3 is stuck on the other surface of the resinous film 1. Subsequently, as shown in FIG. 1(d), etching is performed on the metal foil 2 such that a necessary circuit pattern is formed on the resinous film 1. Finally, as shown in FIG. 1(e), by peeling the protective film 3 from the resinous film 1, the circuit board is completed.

However, this known method has such a drawback that perforating of the resinous film 1 by press working and sticking and peeling of the protective film 3 are time-consuming operations. Furthermore, the known method has such a disadvantage that a lead-in wire 10 (FIG. 1(e)) for connection to an LSI chip is readily deformed.

FIGS. 2(a) to 2(f) show another prior art method of manufacturing a circuit board. As shown in FIG. 2(a), copper flush plating is initially performed on one surface of a polyimide film 5 acting as a substrate so as to produce an electrically conductive film 6. Subsequently, as shown in FIG. 2(b), resist 7 is coated on the electrically conductive film 6 and on the other surface of the polyimide film 5 and then, is subjected to imaging by exposure and development. Thereafter, as shown in FIG. 2(c), copper additive plating is performed on the electrically conductive film 6 so as to form a circuit pattern 8 on the electrically conductive film 6. Then, as shown in FIG. 2(d), etching is performed on the polyimide film 5 so as to define an opening 9. Subsequently, as shown in FIG. 2(e), the resist 7 is peeled from the electrically conductive film 6 and the polyimide film 5. Finally, as shown in FIG. 2(f), unnecessary portions of the electrically conductive film 6 are removed from the polyimide film 5 and thus, the circuit board is completed.

Meanwhile, this prior art method has such an inconvenience that plating of the electrically conductive film 6 and the circuit pattern 8 and coating, exposure, development and peeling of the resist 7 are time-consuming operations. Furthermore, this prior art method has also been disadvantageous in that the lead-in wire 10 shown in FIG. 2(f) is likely to be deformed.

SUMMARY OF THE INVENTION

Accordingly, an essential object of the present invention is to provide, with a view to eliminating the disadvantages inherent in the conventional methods, a method of manufacturing a circuit board, in which manufacturing processes are simplified.

In order to accomplish this object of the present invention, a method of manufacturing a circuit board, according to the present invention comprises the steps of: providing an electric conductor on one surface of a substrate made of flexible synthetic resin; and selectively irradiating a laser beam onto the substrate from the other surface of the substrate so as to sublimate a portion of the substrate such that an opening is formed on the substrate, with the electric conductor traversing the opening.

In the method of the present invention, the electric conductor is provided on the one surface of the substrate made of flexible synthetic resin and the laser beam is selectively irradiated onto the substrate from the other surface of the substrate so as to sublimate the portion of the substrate. At this time, it is not necessary to protect the substrate by sticking thereto, for example, a protective film or a resist and thus, the manufacturing processes are simplified. As a result, the circuit board is completed in which the electric conductor traverses the opening of the substrate. Therefore, when an LSI chip, for example, is connected to the circuit board, ultrasonic connection between a terminal pad of the LSI chip and the electric conductor can be performed from the other surface of the substrate, which other surface is not provided with the electric conductor.

BRIEF DESCRIPTION OF THE DRAWINGS

This object and features of the present invention will become apparent from the following description taken in conjunction with the preferred embodiments thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

Figure 1:
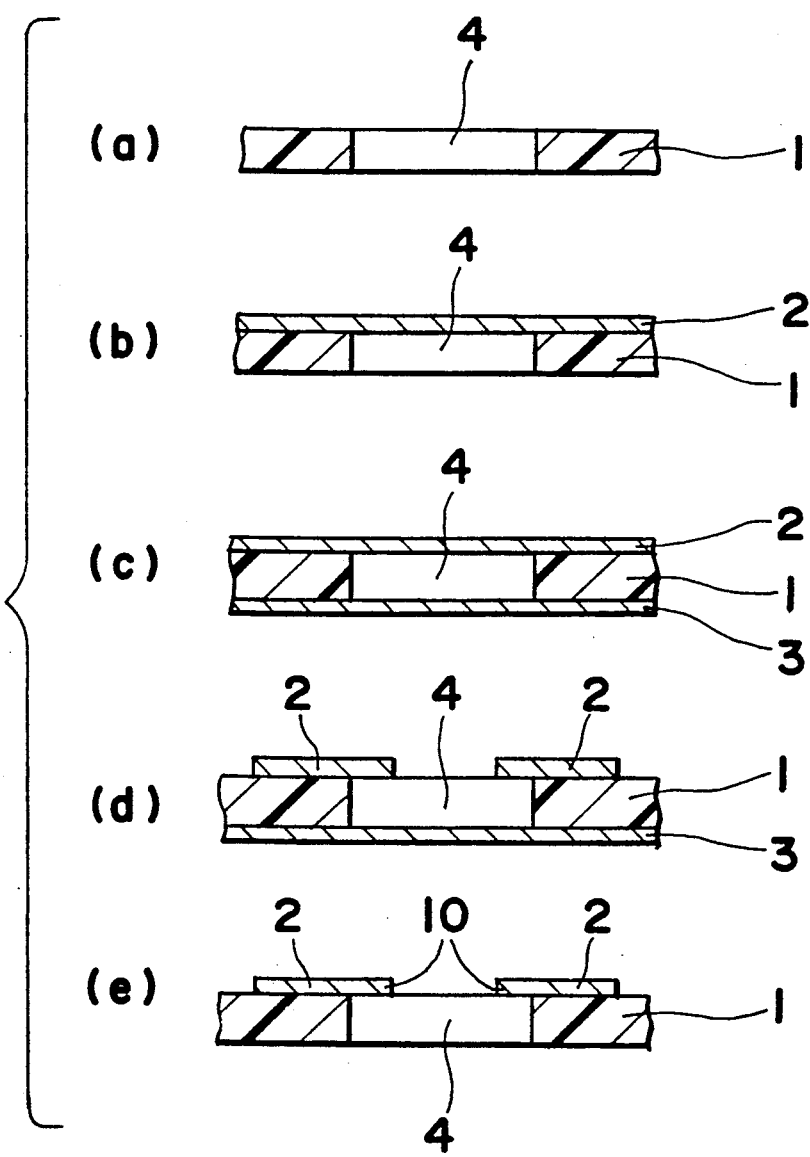
FIGS. 1(a) to 1(e) are sectional views showing a prior art method of manufacturing a circuit board (already referred to)
Figure 2:
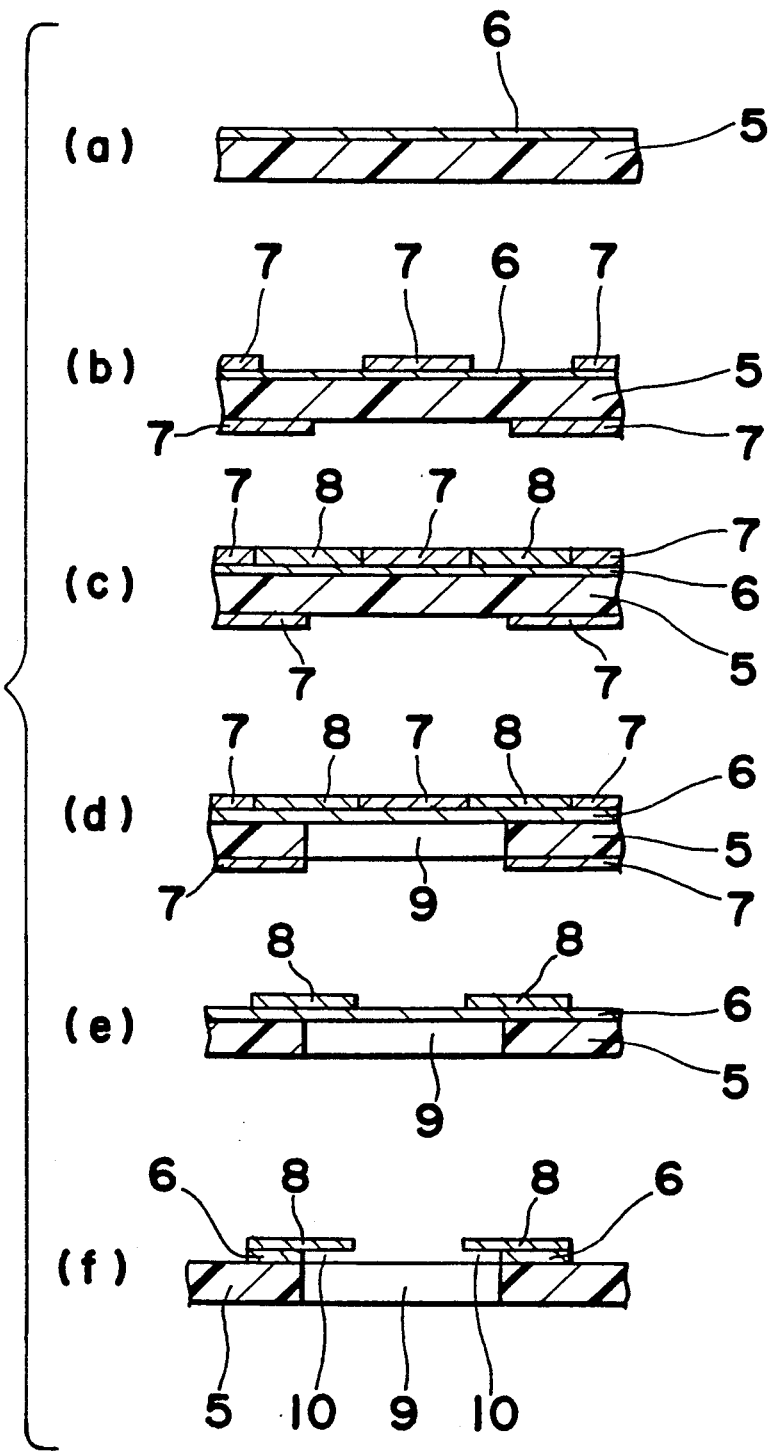
FIGS. 2(a) to 2(f) are sectional views showing another prior art method of manufacturing a circuit board (already referred to)
Figure 3:
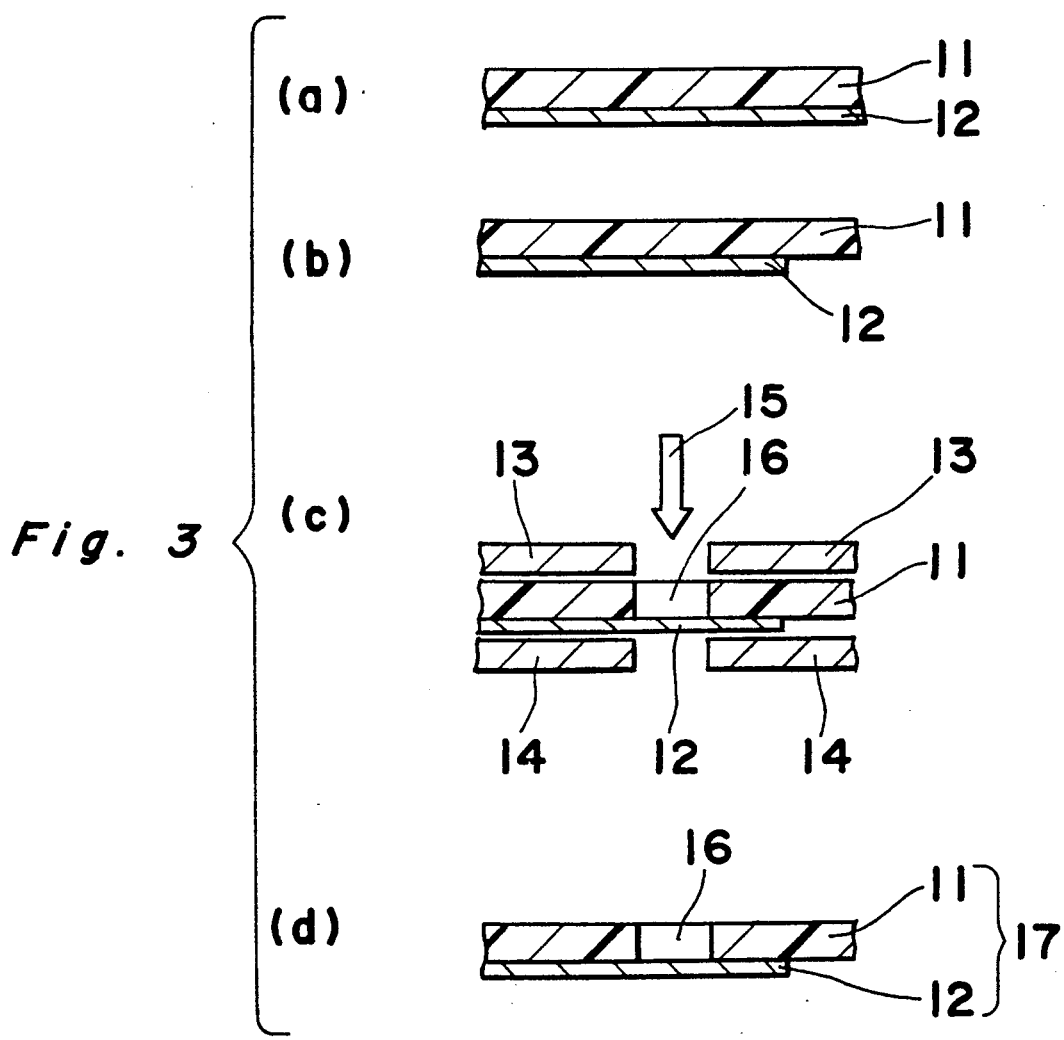
FIGS. 3(a) to 3(d) are sectional views showing a method of manufacturing a circuit board, according to a first embodiment of the present invention.

Referring now to the drawings, there is shown in FIGS. 3(a) to 3(d), a method of manufacturing a circuit board, according to a first embodiment of the present invention. Initially, as shown in FIG. 3(a), a metal foil 12 made of electric conductor such as copper, aluminum, etc. is bonded to one surface of a film 11 acting as a substrate. The film 11 is made of flexible synthetic resin such as polyester, polyimide, etc. Subsequently, as shown in FIG. 3(b), etching is performed on the metal foil 12 so as to produce a necessary circuit pattern. Thereafter, as shown in FIG. 3(c), jig masks 13 and 14 made of glass, stainless steel, etc. are so disposed as to interpose therebetween the film 11 and the metal foil 12. Then, a laser beam 15 is irradiated onto the film 11 so as to sublimate a portion of the film 11 such that an opening 16 is formed on the film 11. The jig masks 13 and 14 have a shape corresponding to the opening 16 so as to not only prevent an other portion of the film 11 than the opening 16 from being heated by the laser beam 15 but secure the film 11 and the metal foil 12 immovably.

Figure 4:
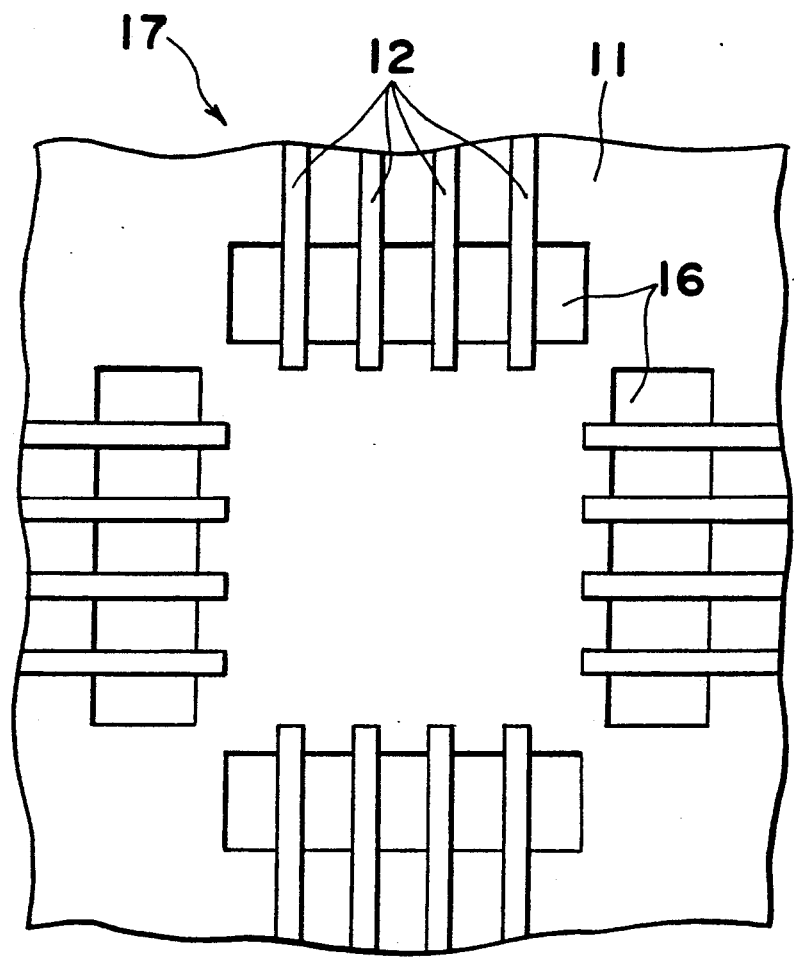
FIG. 4 is a top plan view of the circuit board in the method of FIGS. 3(a) to 3(d)

Temperature of the laser beam 15 is so selected as to sublimate only the film 11. For example, in the case where the film 11 is made of polyester having a melting point of about 270° C. and the metal foil 12 is made of aluminum having a melting point of about 660° C., the laser beam 15 is set at a temperature of 270°-660° C. e.g. 400° C. The laser beam 15 is used for sublimating substance subjected to irradiation of the laser beam 15. Thus, as shown in FIGS. 3(d) and 4, a circuit board 17 is completed. As is apparent from FIG. 4, the metal foil 12 traverses the opening 16.

Figure 5:
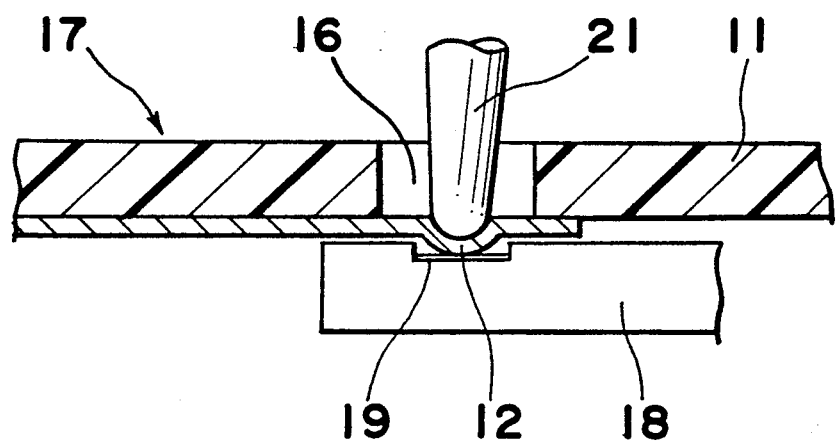
FIG. 5 is a sectional view showing connection between the circuit board and an LSI chip in the method of FIGS. 3(a) to 3(d)
Figure 6:
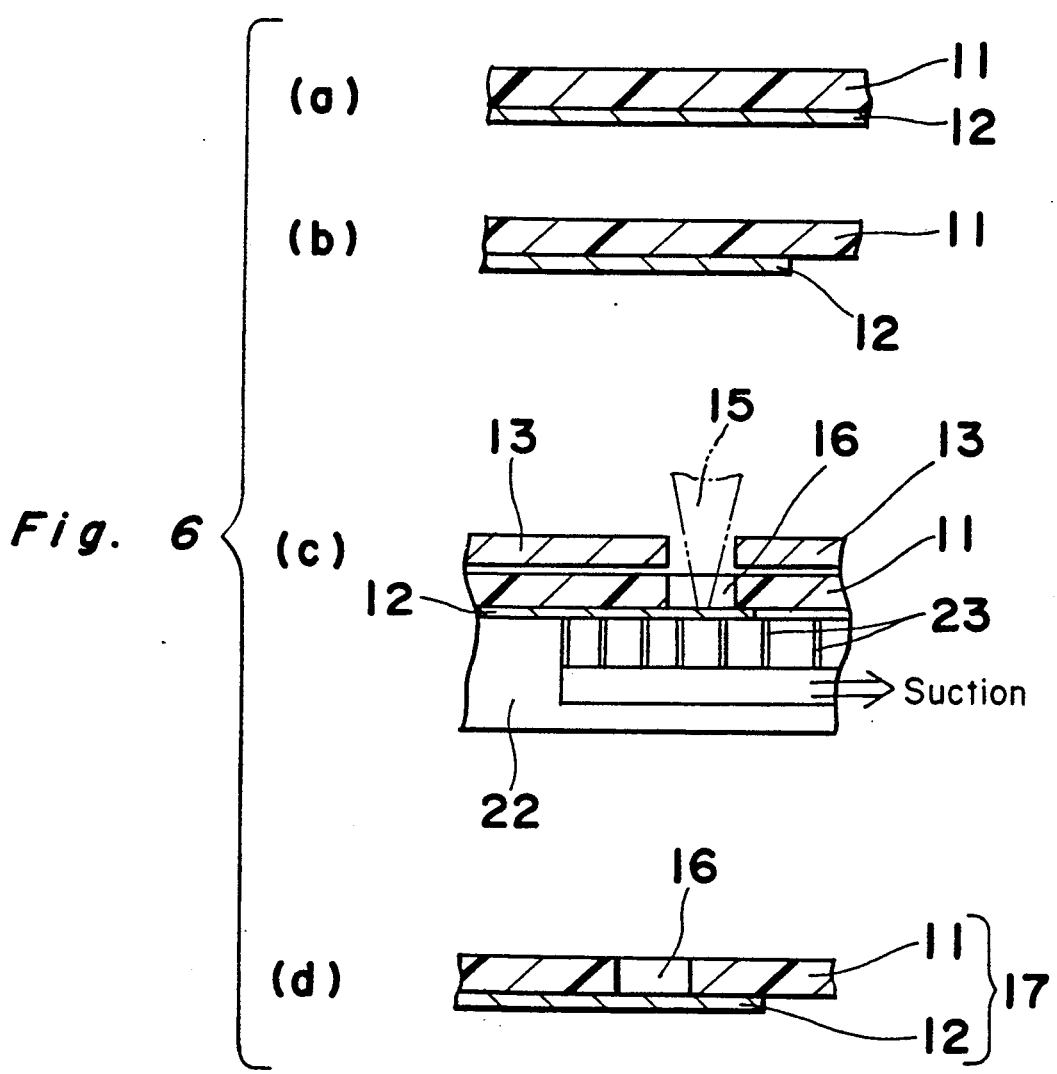
FIGS. 6(a) to 6(d) are views similar to FIGS. 3(a) to 3(d), respectively, particularly showing a second embodiment of the present invention.

FIG. 5 shows connection between the circuit board 17 and an LSI chip 18. A pad 19 acting as an electrode is formed on one surface of the LSI chip 18. The metal foil 12 of the circuit board 17 is electrically connected to the pad 19 by ultrasonic connection. Ultrasonic connection is performed by using an ultrasonic head 21 through the opening 16 from one side of the circuit board 17 remote from the LSI chip 18.

If nitrogen gas, argon gas or the like is blown over the film 11 simultaneously with irradiation of the laser beam 15 thereto in the process for forming the opening 16, not only removal of the sublimated portion of the film 11 is facilitated but the opening 16 and a peripheral portion of the opening 16 can be cooled. In addition to the above described gases, a gas for preventing oxidation of the metal foil 12 can be properly employed. Meanwhile, if continuous irradiation of the laser beam 15 having a width corresponding to that of the opening 16 and beam pulse laser are numerically controlled, the opening 16 can be formed without using the jig masks 13 and 14.

As described above, in this embodiment, since it is not necessary to employ a protective film and resist which have been required to be used in conventional methods, the number of the manufacturing processes can be reduced greatly. Therefore, the manufacturing processes of the circuit board can be simplified remarkably.

FIGS. 6(a) to 6(d) show a method of manufacturing a circuit board, according to a second embodiment of the present invention. This method of the second embodiment is characterized by use of a flat stage 22 in place of the jig mask 14. Namely, by cooling the stage 22 as a whole, a circuit pattern formed by the metal foil 12 is cooled and thus, damage to the circuit pattern can be lessened. Furthermore, it can also be so arranged that by sucking air through a number of minute pores 23 formed on the stage 22, the film 11 is secured in position. In the method of the second embodiment, the same effects as those of the method of the first embodiment can be achieved.

As is clear from the foregoing description, in accordance with the present invention, the manufacturing processes of the circuit board can be simplified remarkably.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of manufacturing a circuit board mounted with an LSI chip, comprising the steps of:
   providing an electric conductor on one surface of an electrically insulating substrate made of flexible synthetic resin;
   selectively irradiating onto the other surface of the substrate a laser beam having a temperature for sublimating at least the substrate so as to form an opening on the substrate;
   providing the LSI chip on the one surface of the substrate at a location corresponding to the opening and the electric conductor; and
   electrically connecting the LSI chip and the electric conductor by using an ultrasonic head from the other surface of the substrate through the opening.

2. A method as claimed in claim 1, including, in the step of irradiating with the laser beam, disposing first and second jig masks on opposite sides of the substrate and the electric conductor to prevent another portion of the substrate than the opening from being heated by the laser beam and to secure the substrate and the electric conductor immovably.

3. A method as claimed in claim 2, wherein in the step of irradiating includes blowing a gas comprised of either nitrogen or argon over the substrate so as to facilitate removal of the sublimated portion of the substrate and cool the opening and a peripheral portion of the opening.

4. A method as claimed in claim 3 including blowing a gas over the electric conductor of a type for preventing oxidation of the electric conductor.

* * * * *